United States Patent
Kim et al.

(10) Patent No.: US 6,809,567 B1
(45) Date of Patent: Oct. 26, 2004

(54) SYSTEM AND METHOD FOR MULTIPLE-PHASE CLOCK GENERATION

(75) Inventors: Ook Kim, Palo Alto, CA (US); Hung Sung Li, Sunnyvale, CA (US); Inyeol Lee, Cupertino, CA (US); Gyudong Kim, San Jose, CA (US); Yongman Lee, Pleasanton, CA (US)

(73) Assignee: Silicon Image, Sunnyvale, CA (US)

( * ) Notice: Subject to any disclaimer, the term of this patent is extended or adjusted under 35 U.S.C. 154(b) by 206 days.

(21) Appl. No.: 09/989,645

(22) Filed: Nov. 20, 2001

Related U.S. Application Data

(60) Provisional application No. 60/282,672, filed on Apr. 9, 2001.

(51) Int. Cl.[7] .................................................. H03L 7/00
(52) U.S. Cl. ........................ 327/160; 327/115; 327/117; 327/295
(58) Field of Search ................................ 327/160, 165, 327/291, 295–297, 355, 356, 105, 107, 113–117, 141, 144, 155, 151; 331/37, 42, 57, DIG. 3

(56) References Cited

U.S. PATENT DOCUMENTS

| | | | | | |
|---|---|---|---|---|---|
| 5,230,013 A | * | 7/1993 | Hanke et al. | ................ | 375/119 |
| 5,239,274 A | * | 8/1993 | Chi | ................................ | 331/57 |
| 5,268,656 A | * | 12/1993 | Muscavage | ................... | 331/45 |
| 5,448,193 A | * | 9/1995 | Baumert et al. | ............. | 327/156 |
| 5,502,418 A | * | 3/1996 | Arai | .............................. | 331/57 |
| 5,550,515 A | * | 8/1996 | Liang et al. | ................... | 331/11 |
| 5,786,732 A | * | 7/1998 | Nielson | ........................ | 331/1 A |
| 5,982,237 A | * | 11/1999 | Pax et al. | .................... | 331/1 A |
| 6,122,336 A | * | 9/2000 | Anderson | .................... | 375/371 |
| 6,160,426 A | * | 12/2000 | Lee | ............................. | 327/116 |
| 6,380,774 B2 | * | 4/2002 | Saeki | .......................... | 327/119 |
| 6,424,192 B1 | * | 7/2002 | Lee et al. | .................... | 327/156 |

* cited by examiner

*Primary Examiner*—Timothy P. Callahan
*Assistant Examiner*—Hai L. Nguyen
(74) *Attorney, Agent, or Firm*—Perkins Coie LLP

(57) ABSTRACT

A system and method for multiple-phase clock generation is disclosed. In one embodiment, a multiple-stage voltage controlled oscillator ("VCO") transmits a plurality of clock phases to a clock divider circuit which produces the desired number of clock phase outputs. The clock divider circuit in this embodiment includes a state machine, e.g., a modified Johnson counter, that provides a plurality of divided down clock phases, each of which is connected to a separate modified shift register. Each modified shift register contains D-type flip-flops and each D-type flip-flop provides a separate clock phase output. In one embodiment the number of clock phase outputs of the multiple-phase clock is a function of the number of VCO clock phases times the number of desired states in the modified Johnson counter.

68 Claims, 10 Drawing Sheets

SYSTEM AND METHOD FOR MULTIPLE-PHASE CLOCK GENERATION

CROSS-REFERENCE TO RELATED APPLICATION

This patent application claims the benefit of U.S. Provisional Patent Application No. 60/282,672, filed Apr. 9, 2001, incorporated herein by reference.

BACKGROUND

1. Technical Field

This invention relates to systems and methods for multiple-phase clock generation.

2. Description of the Background

Digital circuitry is being used in applications requiring seemingly ever faster processing speeds. For example, complementary metal oxide semiconductor ("CMOS") devices have been used to sample high-frequency carrier-modulated signals in order to recover the data in such signals, often as part of a communications device. Because the frequency of the signals is sometimes far in excess of the speeds capable of any individual CMOS device, the signals are oversampled by arrays of similar sampling circuitry clocked by multiple-phase ("multi-phase") clocks in order to simulate a single much faster device. Oversampling of such high-speed signals makes it possible to use comparatively slow CMOS devices for high-speed applications such as communications and computing by using multiple-phase clocks to process high-speed signals in parallel. Correspondingly, as the underlying signal frequency increases, the number of clock phases needed to accommodate the signal frequency increases.

In many devices today, ring oscillators are used to generate multiple-phase clocks. However, this technique suffers from a number of disadvantages in the environment just described. More specifically, the quality of a multi-phase clock degrades as the number of clock phases increases. Furthermore, generation of a larger number of multiple-phase clocks makes layout and routing more difficult in an integrated circuit chip.

Another technique used to generate multi-phase clocks employs cascaded voltage-controlled oscillator ("VCO") cell stages. Like the ring-oscillator, the number of waveform samplers is the same as the number of VCO cells. Also like the ring-oscillator, as cells are added the precision of the multi-phase clock degrades, thereby placing a practical limit on how many cells can be added. For example, in FIG. 1 there is shown a prior art schematic diagram having cascaded ring-oscillator-type VCO cells. To increase the number of phases corresponding to an increased number of samplers, the number of VCO cells must also increase by adding more stages into the ring. In general, the number of VCO stages rises proportionally with the increasing frequency of the waveform to be received. However, as the number of VCO cells increases, the power consumption and layout area necessary for multiple-phase bus routing also increase. As a result, the optimum layout of a VCO and other sampling circuitry becomes increasingly difficult as the number of cells increases.

Another technique used is clock interpolation, which generates more phases from a given multi-phase clock. For example, in FIG. 2 there is shown a prior art schematic diagram having a clock interpolator circuit. Unfortunately, this technique generates phase errors in the interpolated clocks. For example, if a clock interpolator receives two clock signals, clock A and clock B, the resulting output becomes the interpolated values of clock A and clock B. Unfortunately, this technique generates errors which makes such an interpolated clock signal deviate from the ideal value. If the clock phases have short rise/fall times then the interpolated value would deviate from the ideal value. This is because the inputs of clock interpolator are already in non-linear region at the interpolation time. This makes interpolator deviate from ideal location because the linear rule is no longer valid. If the clock phases for the clock interpolator have bigger rise/fall times then the interpolated value is very close to ideal value, however, this increases the effect of offsets and noise in the interpolating circuit, which would eventually degrade the quality of signals generated by an associated phase-locked loop ("PLL"). Also, if the clock edges are too sharp, the interpolated clock signal would not be an exact interpolation of the other phases used. To compensate for the noise increase, the power consumption of this device may be increased, but at the expense of eventually increasing the power consumption of the total system in which the device is embedded. Therefore, to realize a wide range of operations using clock interpolation, the circuit complexity and power consumption becomes impractical at some point.

Therefore, it would be desirable to have system and method for generating a multi-phase clock that mitigates the deleterious effects inherent in other multi-phase clocks as additional phases are generated.

DETAILED DESCRIPTION OF THE EMBODIMENTS

The invention will now be described with respect to various embodiments. The following description provides specific details for a thorough understanding of, and enabling description for, these embodiments of the invention. However, one skilled in the art will understand that the invention may be practiced without these details. In other instances, well-known structures and functions have not been shown or described in detail to avoid unnecessarily obscuring the description of the embodiments of the invention. For each embodiment, the same reference numbers and acronyms identify elements or acts with the same or similar functionality for ease of understanding and convenience.

The problems and disadvantages described above are overcome by embodiments of the invention, which in at least one embodiment provides a multiple-phase clock capable of generating multiple clock phases with reduced noise and simplified chip layout characteristics. The invention is initially described in the context of an embodiment having a three cell voltage-controlled oscillator ("VCO") providing six output clock phases to a clock divider. The clock divider is further comprised of a modified Johnson-type counter whose outputs, along with the outputs of the VCO are transmitted to a number of modified shift registers. The modified shift registers produce a number of clock phases corresponding to the number of D-type flip-flops that make up each modified shift register. However, other embodiments of the invention are susceptible to a variety of different configurations such as a VCO including more or less than three stages and differing amounts of stages in the modified Johnson counter and the modified shift registers. Furthermore, one can apply embodiments of the invention in a variety of applications that use multi-phase clocks in high-speed data links and RF transceivers, etc. Wireless devices, for example, often incorporate multi-phase clocks and may include embodiments of the invention.

Figure 1:
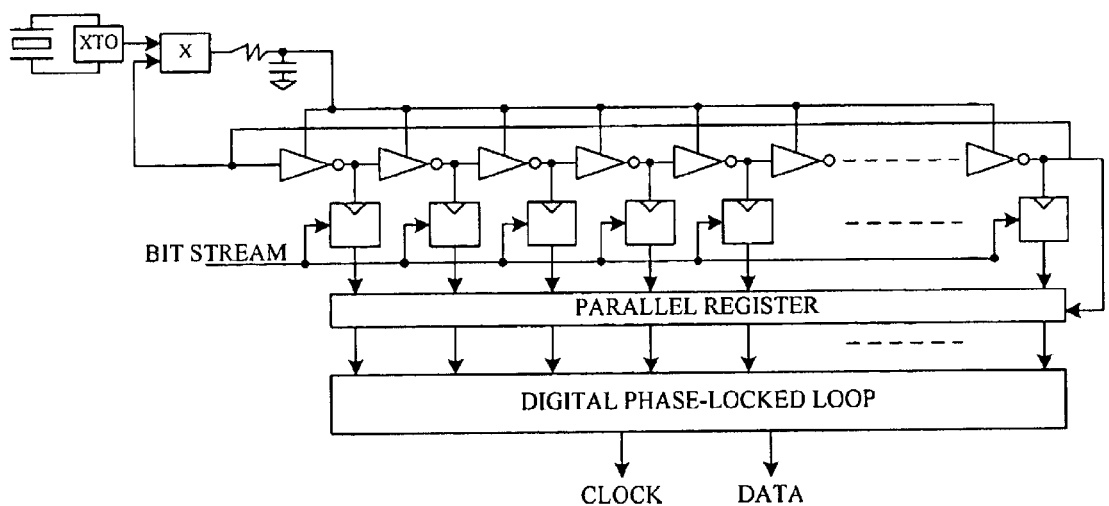
FIG. 1 is a prior art multi-phase clock.
Figure 2:
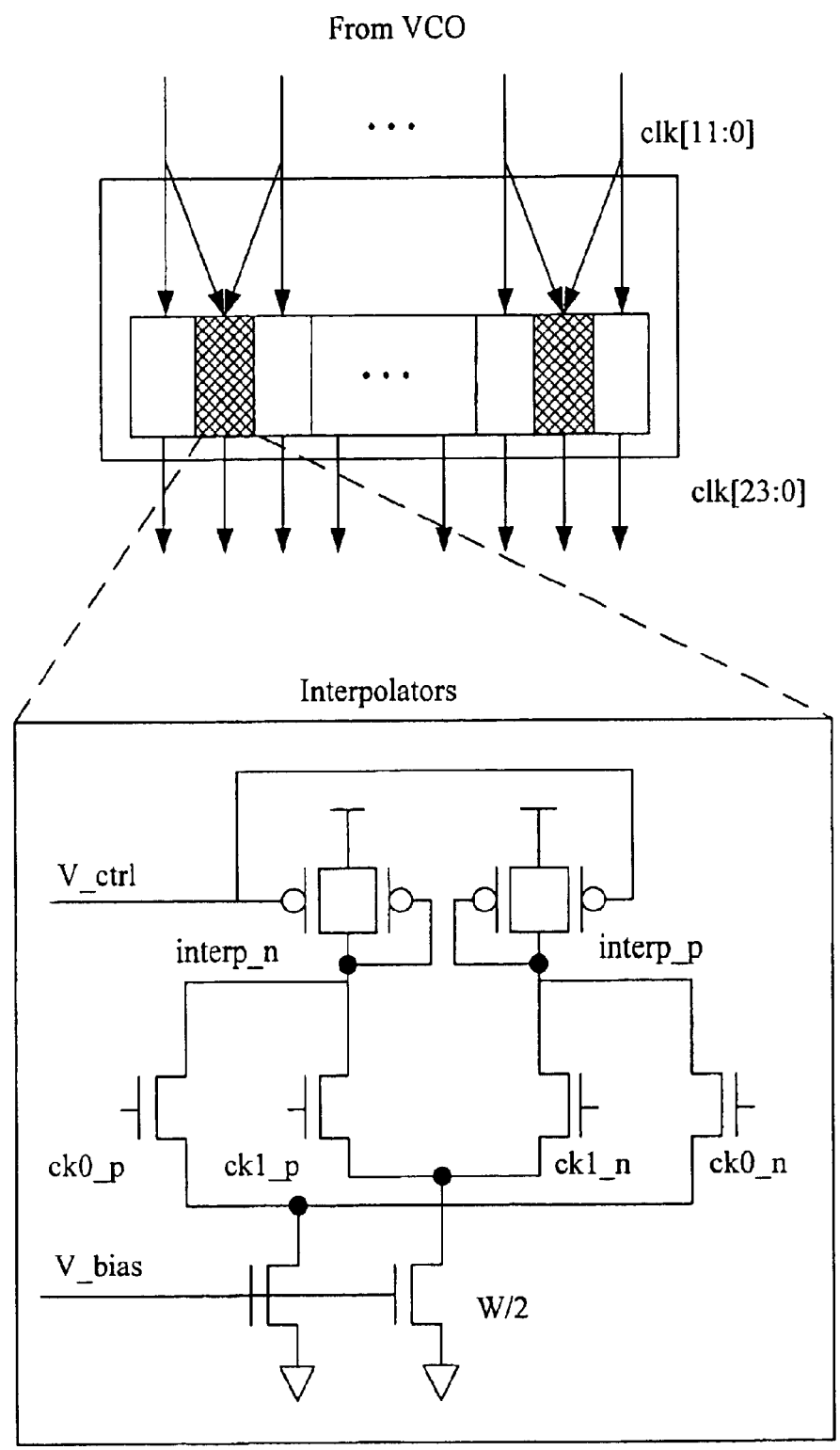
FIG. 2 is a prior art clock interpolator.
Figure 3:
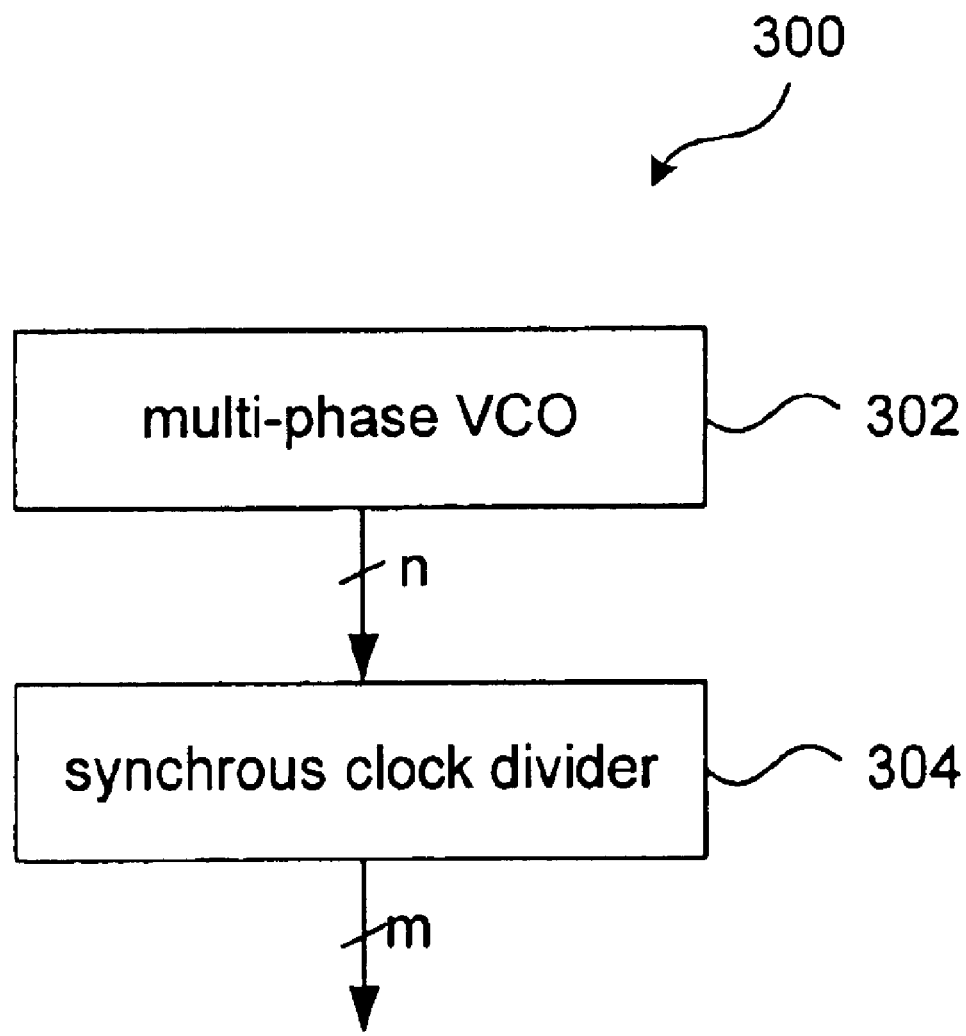
FIG. 3 is a high-level schematic diagram of a multi-phase clock of one embodiment of the invention.

Turning to FIG. 3, there is shown a high-level schematic diagram of a multi-phase clock 300 of one embodiment of the invention. The multi-phase clock 300 includes a multi-phase VCO 302 having n outputs, where n is a whole number. The n outputs from the multi-phase VCO 302 are fed into a synchronous clock divider circuit 304 in order to produce m outputs, where m is also a whole number. The system generates multiple phases from each output n of the multiple-phase VCO 302. In one embodiment, the m outputs from the synchronous clock divider circuit 304 are the product of n and the number of counter stages c in the synchronous clock divider circuit 304 as is described in greater detail herein.

The multi-phase clock 300 may be more sensitive to the external electrical environment and benefits from various measures to reduce noise from signal processing blocks. The multi-phase clock 300 can be easily separated from other circuitry. Various separation methods such as the use of guard rings, shielding, supply regulators and coupling capacitors are available to reduce noise. This enhances the noise performance of the VCO. In addition, since the VCO block has a smaller number of edges, the area required stages for the VCO would be smaller. Since there are fewer output bus lines, it would be relatively easy to route to a signal-processing unit. Also, by reducing the number of bus wires required to make multiple stages, one can reduce the valuable integrated circuit ("IC") chip area used to route multiple phases to the signal processing circuit. The interference into/from the clock routing bus is reduced also.

Figure 4:
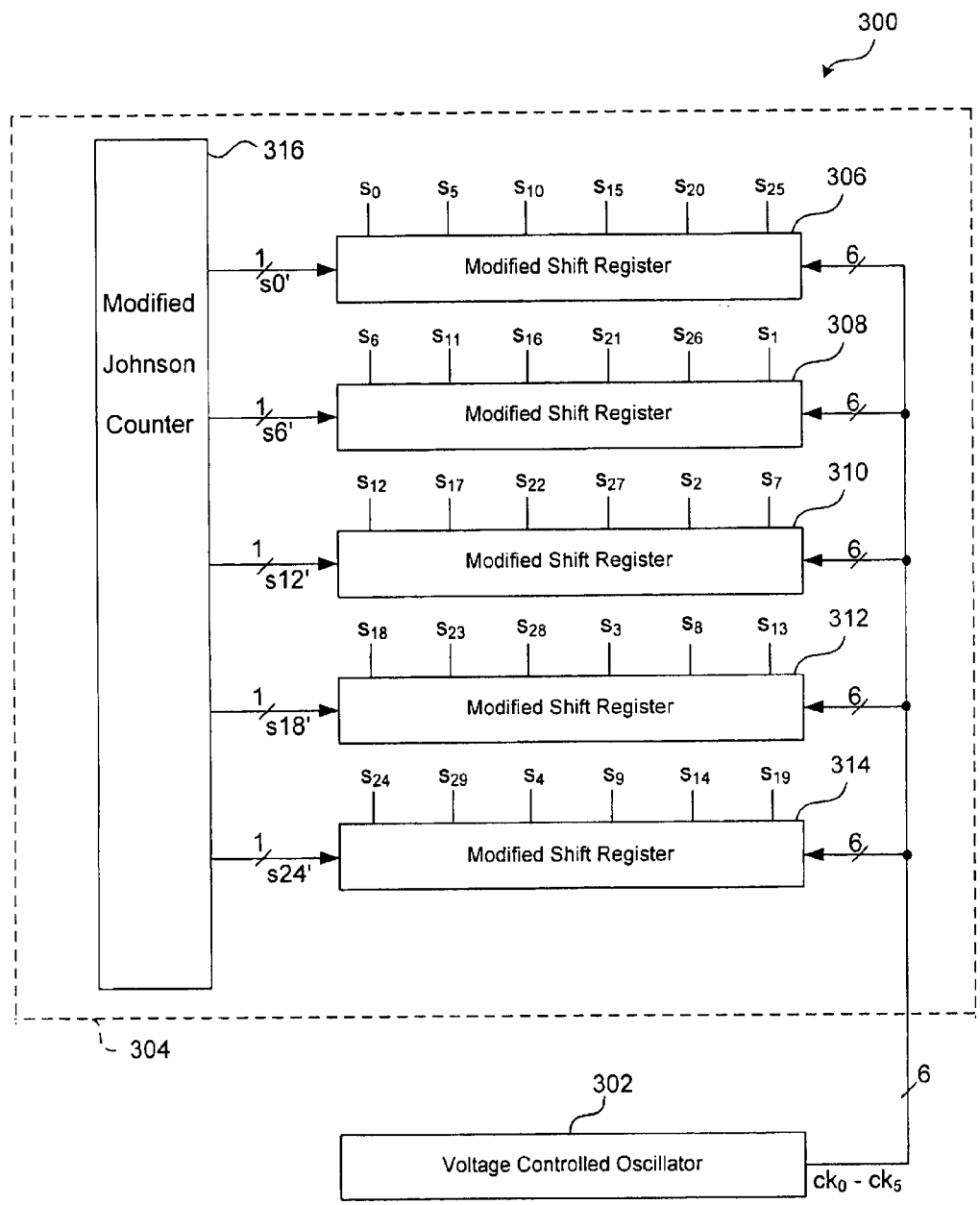
FIG. 4 is a more detailed schematic diagram of the embodiment of FIG. 3.

Turning to FIG. 4, there is shown a more detailed schematic diagram of one embodiment of the multi-phase clock 300. By way of example, the multi-phase VCO 302 has six outputs (n =6) identified as $ck_0$ through $ck_5$. In this example, the VCO 302 is a 3-stage full-differential VCO. Each of the six multi-phase VCO 302 outputs $ck_0$–$ck_5$ are connected to one of six registers in each of five modified shift registers 306, 308, 310, 312 and 314. Each of the five modified shift registers 306–314 also receive an input signal $s_0'$, $s_6'$, $s_{12}'$, $s_{18}'$ and $S_{24}'$, respectively, from a modified Johnson counter 316. In this example, the VCO which generates 6 phases which are connected to a synchronous divider 304 that generates a total of 30 phases. The operation of the multi-phase clock 300 is described in more detail below. The divider 304, i.e., the modified Johnson counter 316 and the modified shift registers 306–314, may be composed of high-speed flip-flops. Each outgoing edge of the divider 304 depends on the states of the divider 304 and one specific edge of VCO 302 output clock edges. This eliminates the need for interpolation of edges. Further, the modified Johnson counter 316 is operating with comparatively smaller rise/fall time clock edges and the noise can be more easily minimized by those multiple phase generation stages because this circuit is not dependent on fast clock edges to get better interpolation of clocks. In implementation, dummy stages may be added to more evenly distribute loads and equalize timing depending on the number of phases desired.

There are numerous combinations of the number of VCO stages and the division ratios. For an illustration purpose only, the example is used for generating 30 phases out of 6 phases using a divide by 5 circuit 304. It would be apparent to those skilled in the art that there are also numerous other ways to implement a counter similar to the Johnson counter 316 and/or storage devices similar to the modified shift registers 306–314. The Johnson counter 316 enables the use simple logic in the feedback path of dividers and enables the counter function to be performed at a higher clock frequency. Because the divider 316 structure is very regular, the delays can be made to be uniform, producing a better multi-phase clock 300. However, a basic Johnson counter has some drawbacks related to some forbidden states which are overcome in one embodiment of the invention. More specifically, if the initial conditions of a basic Johnson counter are set to one of the desired states, it will repeat those desired states. Otherwise, if the initial conditions of a basic Johnson counters is set to one of the undesired states, the cycle would be different and may include some reoccurring undesired states, which may be a problem in some embodiments of the invention.

Figure 5:
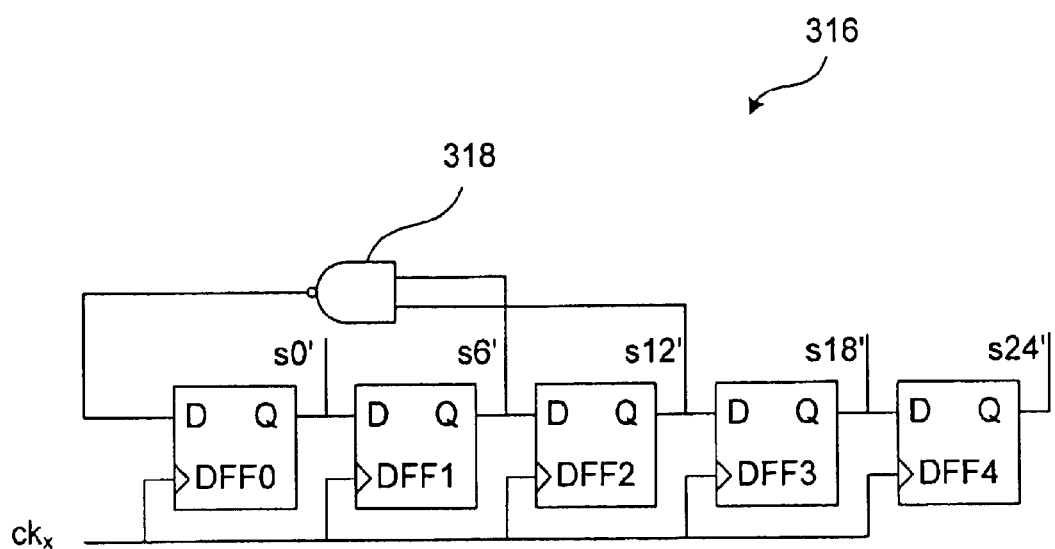
FIG. 5 is a schematic diagram of a modified Johnson counter.

Turning to FIG. 5, there is shown a modified Johnson counter 316 with inhibition logic 318 for this problem. Continuing with the 30-phase multi-phase clock 300 example from above, the modified Johnson counter 316 is comprised of five D-type flip-flops labeled DFF0, DFF1, DFF2, DFF3 and DFF4. Each of the five flip–flops DFF0–DFF4 are connected in a chain in the following manner: a D input of DFF4 is connected to a Q output of DFF3, a D input of DFF3 is connected to a Q output of DFF2, a D input of DFF2 is connected to a Q output of DFF1, a D input of DFF1 is connected to a Q output of DFF0 and a D input of DFF0 is connected to the inhibition logic 318 which in one embodiment is a NAND gate. The NAND gate 318 is connected to the Q outputs of DFF1 and DFF2. The Q outputs of DFF0–DFF4 are s0', s6', s12', s18' and s24', respectively. The labeling of the Q outputs of DFF0–DFF4 correspond to the first phase output of the modified shift registers 306–314 connected to those Q outputs, respectively. The modified Johnson counter is commonly clocked with one of the VCO 302 clock phases, in one embodiment $ck_0$ is used.

Figure 6:
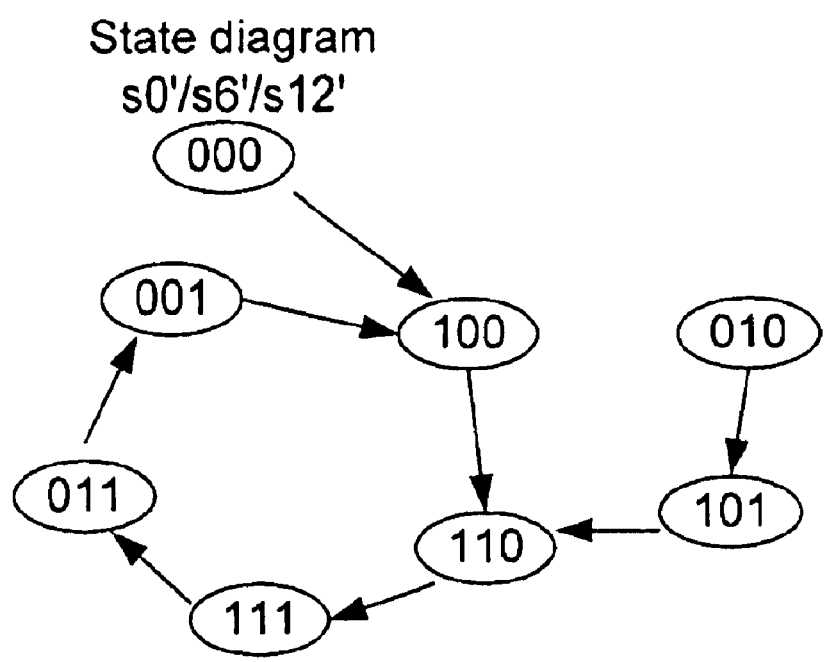
FIG. 6 is a state diagram for the modified Johnson counter.

Turning to FIG. 6, there is shown a state diagram for the modified Johnson counter 316. The s0', s6' and s12' Q outputs of DFF1, DFF2 and DFF3, respectively, are shown. The NAND gate 318 combines the outputs s6' and s12' in a NAND function to produce output s0' in the next clock period as DFF0 is clocked. Because three different binary states are considered together, there is the possibility of $2^3=8$ different states. Of the eight states, five (100, 110, 111, 011 and 001) form a desired five state ring. Once the modified Johnson counter 316 enters into the five state ring, it will not leave that ring but rather will continue to sequence around the ring in a different state every clock cycle. This effectively divides the frequency of $ck_0$ by five. The remaining three states (000, 010 and 101) are not desired, but the modified Johnson counter 316 would encounter some of these states at most one time when the modified Johnson counter 316 is initialized. This result derives from the inhibition logic 318 which effectively feeds all the undesired states directly (000 and 101), or indirectly (010) into the desired five state ring.

Figure 7:
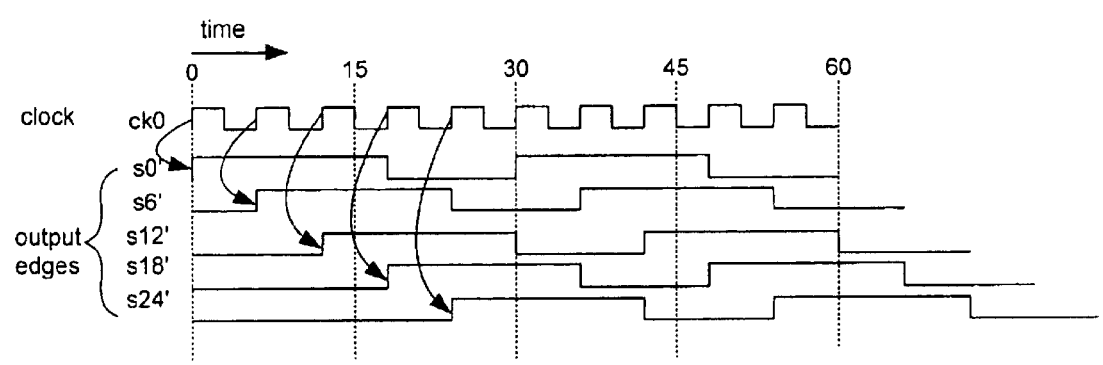
FIG. 7 is a timing diagram illustration of the operation of the modified Johnson counter.

Turning to FIG. 7, there is shown a timing diagram illustration of the operation of the modified Johnson counter 316. In this example, VCO 302 clock phase $ck_0$ is used to clock the clock inputs of the modified Johnson counter 316. From the $ck_0$ clock edges we can see that states of the s0', s6', s12', s18' and s24' outputs produced by the modified Johnson counter 316, and how those outputs relate to $ck_0$. Note that delays are considered to be zero for illustration purposes here. The D-type flip-flops DFF0–DFF4 in the modified Johnson counter 316 are positive-edge triggered. In this example, s0', s18', s24' are considered to be in a logical one state at time zero, while s6' and s12' are considered to be in a logical zero state at time zero. Briefly referring back to FIG. 6, the initial s0'/s6'/s12' state at time zero is 100. As $ck_0$ progresses through ten clock cycles, the s0'/s6'/s12' state progresses from 100 at time zero to 110, 111, 011, 001, 100, 110, 111, 011 and 001. Referring again to FIG. 7, it can be seen that for each $ck_0$ clock cycle, the corresponding clock cycle for s0', s6', s12', s18' and s24' is now at ⅕ of the rate of $ck_0$ and that each of the outputs s0', s6', s12', s18' and s24' is now separated by one $ck_0$ clock cycle from each other or ⅕ of their clock cycles.

Figure 8:
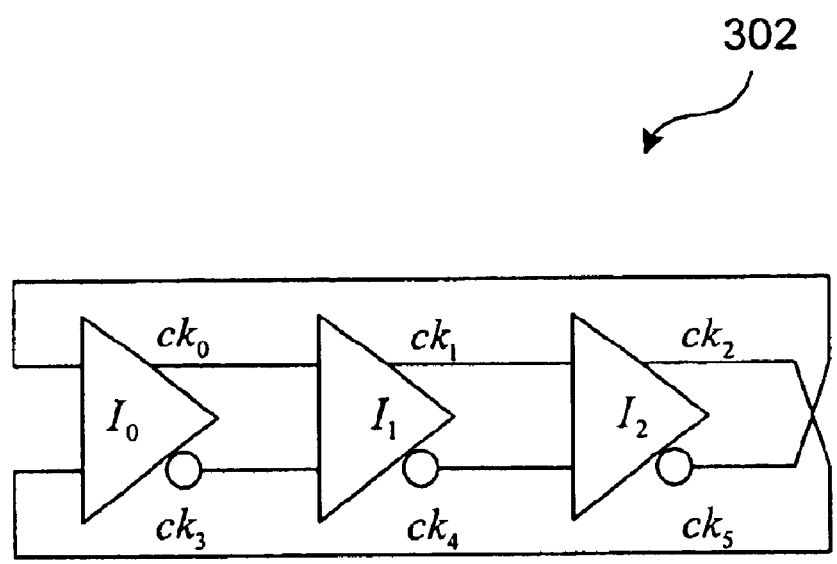
FIG. 8 is a schematic diagram of a 3-stage VCO.

Turning to FIG. 8, there is shown is a schematic diagram of the voltage controlled oscillator 302, wherein the voltage controlled oscillator 302 is comprised of 3 VCO cells. In this embodiment of the invention, the three VCO cells are designated $I_0$, $I_1$, and $I_2$, respectively, as shown. VCO cell $I_0$, produces clock phase outputs $ck_0$ and $ck_3$. VCO cell $I_1$, produces clock phase outputs $ck_1$, and $ck_4$. VCO cell $I_2$, produces clock phase outputs $ck_2$ and $ck_5$. The three VCO cells $I_0$, $I_1$, and $I_2$ are connected in a ring to produce the six different clock phases $ck_0$ through $ck_5$ used in one embodiment of the invention.

Figure 9:
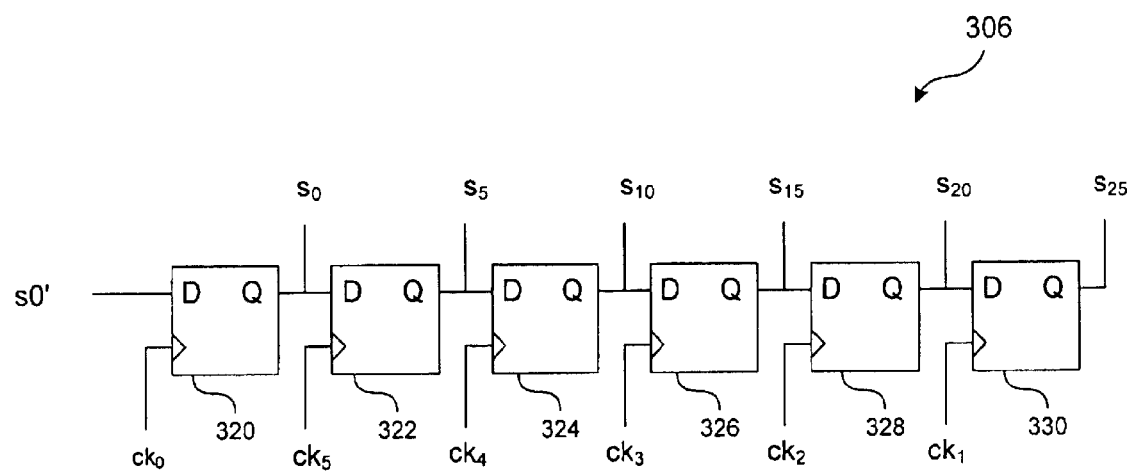
FIG. 9 is a schematic diagram of a modified shift register.

Turning to FIG. 9, there is shown a schematic diagram of modified shift register 306 in one embodiment of the invention. Like the other modified shift registers 308–314, modified shift register 306 is comprised of positive-edge triggered D-type flip-flops. More specifically, modified shift register 306 is comprised of six D-type flip-flops 320, 322, 324, 326, 328 and 330. The modified shift register 306 receives divided down clock phase s0' in a D input of the first D-type flip-flop 320. The Q outputs of D-type flip-flops 320, 322, 324, 326 and 328 are connected to the D inputs of D-type flip-flops 322, 324, 326, 328 and 330, respectively, as shown in FIG. 9. Unlike an unmodified shift register, the six D-type flip-flops 320, 322, 324, 326, 328 and 330 of modified shift register 306 are clocked by clock phases $ck_0$, $ck_5$, $ck_4$, $ck_3$, $ck_2$ and $ck_1$, respectively. The clock phases $ck_0$–$ck_5$ are selected to provide a particular output clock phase of the thirty clock phases $s_0$–$s_{29}$ generated by the multi-phase clock 300.

Figure 10:
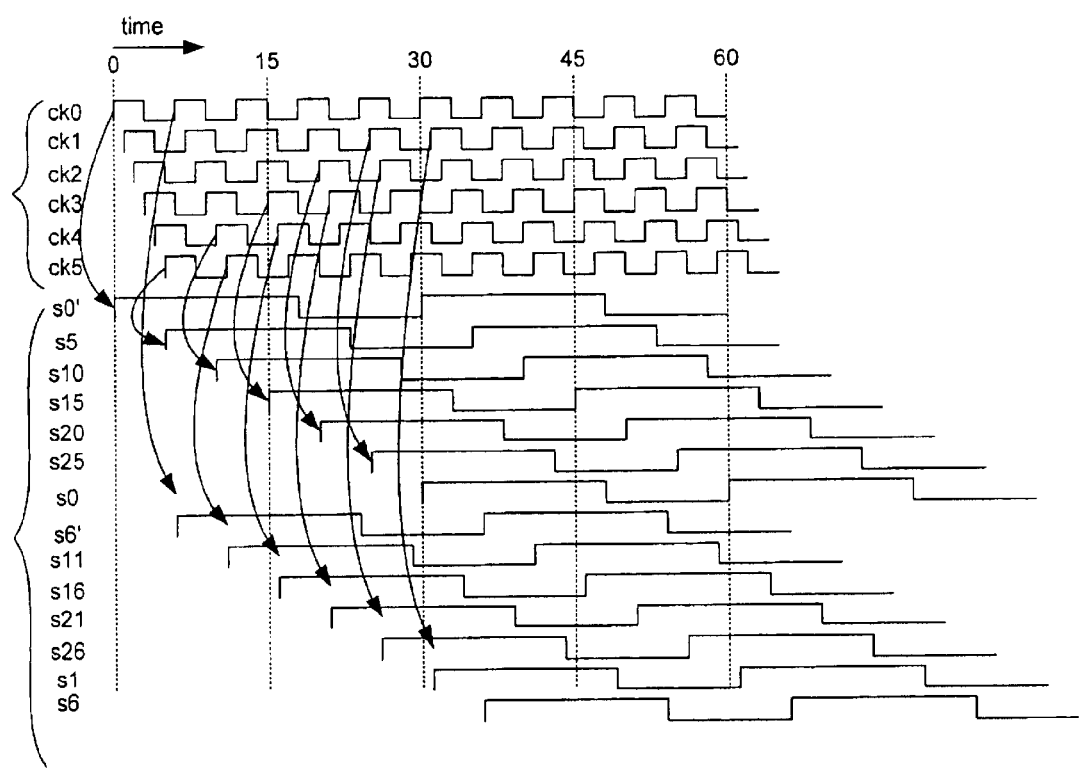
FIG. 10 is a timing diagram illustration of a multi-phase clock according to the embodiment of FIG. 4.

Turning to FIG. 10, there is shown a timing diagram illustrating a 30-phase multi-phase clock 300 according to one embodiment of the invention. The six clock phases $ck_0$–$ck_5$ produced by the VCO 302 are shown towards the top of FIG. 10. Each of the six clock phases $ck_0$–$ck_5$ is used to clock one D-type flip-flop in each of the modified shift registers 306–314. More specifically, $ck_0$ clocks a single D-type flip-flop in each of the modified shift registers 306–314 to produce $s_0$, $s_6$, $s_{12}$, $s_{18}$ and $s_{24}$, respectively. The VCO 302 clock phase $ck_5$ clocks a single D-type flip-flop in each of the modified shift registers 306–314 to produce $s_5$, $s_{11}$, $s_{17}$, $s_{23}$ and $s_{29}$, respectively. The VCO 302 clock phase $ck_4$ clocks a single D-type flip-flop in each of the modified shift registers 306–314 to produce $s_{10}$, $s_{16}$, $s_{22}$, $s_{28}$ and $s_4$, respectively. The VCO 302 clock phase $ck_3$ clocks a single D-type flip-flop in each of the modified shift registers 306–314 to produce $s_{15}$, $s_{21}$, $s_{27}$, $s_3$ and $s_9$, respectively. The VCO 302 clock phase $ck_2$ clocks a single D-type flip-flop in each of the modified shift registers 306–314 to produce $s_{20}$, $s_{26}$, $s_2$, $s_8$ and $s_{14}$, respectively. And finally, the VCO 302 clock phase $ck_1$, clocks a single D-type flip-flop in each of the modified shift registers 306–314 to produce $s_{25}$, $s_1$, $s_7$, $s_{13}$ and $s_{19}$, respectively. For clarity of the drawing purposes, only the clock phase outputs for modified shift registers 306 and 308 are shown in FIG. 10. Because $ck_0$ is delayed by one clock skew delay to the $ck_5$, we'll get $s_5$ at the output of second D-type flip-flop at the modified shift register 306, and so on. By clocking all thirty D-type flip-flops in the modified shift registers 306–314, with the six clock phases $ck_0$–$ck_5$ from the VCO 302 as described, all 30 clock phases are produced.

In the 30 phase example above, there are n=6 outputs from the multi-phase VCO 302 and correspondingly, n=6 D-type flip-flops in each shift register 306–314. The modified Johnson counter 316 has c=5 counter stages. In this example, the total number of multi-phase clocks is n times c equals m, i.e., 6*5=30 clock phases generated. Thus, in order to increase the number of phases, one may increase the number of VCO cells in the VCO 302, the number of modified Johnson counter 316 stages or the number of registers in the modified shift registers 306–314. Because the numbers are multiplied, in a small amount of growth in any one of these devices will produce a proportionally much greater increase in the number of clock phases produced as compared to the length of any one device, thereby minimizing added noise associated with added clock phases and simplifying chip layout because of the more regular structure of embodiments of the multi-phase clock 300.

Thus there has been described a system and method for multiple-phase clock generation. There are numerous benefits of using a synchronous clock divider to generate multiple phases. For example, by having high speed D-type flip-flops instead of previously used circuitry such as ring oscillators, VCO cell and clock interpolators, the circuitry in the invention is simplified and more easily scalable to providing additional phases in terms of noise and chip layout, etc. As more and/or longer modified shift registers are integrated into a chip, one VCO and one modified Johnson counter may be shared throughout the chip because multiple phases can be easily distributed throughout the chip area. Also, optimization of PLL and other circuitry based on multiple phases is possible because the two blocks, the VCO and synchronous clock divider, are relatively independent of each other.

Incorporated by reference herein are all above references, patents, or applications and the following U.S. applications, which are assigned to the assignee of this application: application Ser. No. 10/371,220 filed Feb. 19, 2003, entitled "DATA SYNCHRONIZATION ACROSS AN ASYNCHRONOUS BOUNDARY USING, FOR EXAMPLE, MULTI-PHASE CLOCKS"; application Ser. No. 09/989, 590 filed Nov. 20, 2001, entitled "HIGH-SPEED BUS WITH EMBEDDED CLOCK SIGNALS"; application Ser. No. 09/989,580 filed Nov. 20, 2001, entitled "BIDIRECTIONAL BRIDGE CIRCUIT HAVING HIGH COMMON MODE REJECTION AND HIGH INPUT SENSITIVITY"; application Ser. No. 09/989,587 filed Nov. 20, 2001, entitled "MULTI-PHASE VOLTAGE CONTROL OSCILLATOR (VCO) WITH COMMON MODE CONTROL"; and application Ser. No. 10/043,886 filed Oct. 26, 2001, entitled "CLOCK AND DATA RECOVERY METHOD AND APPARATUS". Aspects of the invention can be modified, if necessary, to employ the systems, functions and concepts of the various patents and applications described above to provide yet further embodiments of the invention.

Embodiments of the invention may be employed in not only systems, but also in subsystems and chips. Complicated semiconductor chips having multiple subsystems operating under several different clocks may often be required to transmit data across such chip subsystems. Embodiments of the invention permit data to be accurately extracted from transmitted waveforms, thereby reducing bit error rates in such chips.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to" Words using the singular or plural number also include the plural or singular number respectively. Additionally, the words "herein," "above," "below," and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list.

The above detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while states are presented in a given order, alternative embodiments may perform routines having states in a different order. The teachings of the invention provided herein can be applied to other systems, not necessarily the system described herein. These and other changes can be made to the invention in light of the detailed description. The elements and acts of the various embodiments described above can be combined to provide further embodiments.

These and other changes can be made to the invention in light of the above detailed description. In general, the terms used in the following claims, should not be construed to limit the invention to the specific embodiments disclosed in the specification, unless the above detailed description explicitly defines such terms. Accordingly, the actual scope of the invention encompasses the disclosed embodiments and all equivalent ways of practicing or implementing the invention under the claims.

While certain aspects of the invention are presented below in certain claim forms, the inventors contemplate the various aspects of the invention in any number of claim forms. For example, while only one aspect of the invention is recited as embodied in a semiconductor chip, other aspects may likewise be embodied in a chip. Accordingly, the inventors reserve the right to add additional claims after filing the application to pursue such additional claim forms for other aspects of the invention.

We claim:

1. A circuit for generating multiple-phase clocks, comprising:
   a voltage-controlled oscillator ("VCO") having a plurality of VCO cells cascaded in a ring structure to generate VCO output clocks; and
   a clock divider for receiving the VCO output clocks, the clock divider further comprising:
     a counter having a plurality of counter outputs, wherein the counter outputs cycle through a plurality of states; and
     a plurality of shift registers, wherein each shift register in the plurality of shift registers further comprises a plurality of registers, each shift register being coupled with the VCO output clocks, and at least one register in each shift register being coupled to a counter output to produce the multiple-phase clocks from the plurality of shift registers wherein a number of multiple-phase clocks is greater than a number of VCO output clocks.

2. The circuit of claim 1, wherein the counter is a Johnson-type counter.

3. The circuit of claim 1, wherein the counter is a Johnson-type counter having circuitry to prevent the reoccurrence of at least one counter state.

4. The circuit of claim 1, wherein the VCO has three op-amps producing six different clock phases.

5. The circuit of claim 1, wherein the shift registers comprise D-type flip-flops.

6. The circuit of claim 1, wherein the shift registers comprise a number of D-type flip-flops corresponding to the number of VCO output clocks.

7. The circuit of claim 1, wherein the plurality of shift registers comprise at least three shift registers.

8. The circuit of claim 1, wherein the plurality of shift registers comprise five shift registers, each shift register having six D-type flip-flops.

9. The circuit of claim 1, wherein the counter has a number c counter outputs, the VCO has a number n VCO output clocks, and the circuit for generating multiple-phase clocks generates a number of multiple-phase clocks equal to c times n.

10. The circuit of claim 1, wherein the counter has a number c counter outputs, each shift register contains r registers, and the circuit for generating multiple-phase clocks generates a number of multiple-phase clocks equal to c times r.

11. The circuit of claim 1, wherein the circuit for generating multiple-phase clocks generates a number of multiple-phase clocks less than or equal to a total number of bits stored in the plurality of shift registers.

12. A circuit for generating multiple-phase clocks, comprising:
    an oscillator having a plurality of oscillator stages and a plurality of oscillator output clocks produced by the plurality of oscillator stages; and
    a clock divider for receiving the oscillator output clocks, the clock divider further comprising:
      a counter having a plurality of counter outputs, wherein the counter outputs eventually cycle through a plurality of states; and
      a plurality of digital storage devices, wherein each digital storage device is coupled with an oscillator output clock, and at least one digital storage device is coupled to a counter output to produce the multiple-phase clocks wherein a number of multiple-phase clocks is greater than a number of oscillator output clocks.

13. The circuit of claim 12, wherein the counter is a Johnson-type counter.

14. The circuit of claim 12, wherein the counter is a Johnson-type counter having circuitry to prevent the reoccurrence of at least one counter state.

15. The circuit of claim 12, wherein the oscillator has three op-amps producing at least three different clock phases.

16. The circuit of claim 12, wherein the plurality of digital storage devices are shift registers.

17. The circuit of claim 12, wherein the plurality of digital storage devices comprise a number of D-type flip-flops corresponding to the number of oscillator output clocks.

18. The circuit of claim 16, wherein the shift registers comprise at least three shift registers.

19. The circuit of claim 12, wherein the plurality of digital storage devices comprise five shift registers, each shift register having six D-type flip-flops.

20. The circuit of claim 12, wherein the plurality of digital storage devices has a number d outputs, the oscillator has a number n oscillator output clocks, and the circuit for generating multiple-phase clocks generates a number of multiple-phase clocks equal to d times n.

21. The circuit of claim 12, wherein the counter has a number c counter outputs, the plurality of digital storage devices has a number d storage devices connected to each counter output, and the circuit for generating multiple-phase clocks generates a number of multiple-phase clocks equal to c times d.

22. The circuit of claim 12, wherein the circuit for generating multiple-phase clocks generates a number of multiple-phase clocks equal to a total number of bits stored in the plurality of digital storage devices.

23. A circuit for generating multiple-phase clocks, comprising:
   oscillator means for generating a plurality of oscillator output clocks; and
   clock divider means for receiving the oscillator output clocks and generating the multiple-phase clocks, the clock divider means further comprising:
      counter means having a plurality of counter outputs, wherein the counter outputs eventually cycle through a plurality of states; and
      digital storage means for storing a plurality of bits corresponding to the multiple-phase clocks, wherein the digital storage means is coupled with some of the plurality of oscillator output clocks and some of the counter outputs.

24. The circuit of claim 23, wherein the counter means is a Johnson-type counter.

25. The circuit of claim 23, wherein the counter means is a Johnson-type counter having circuitry to prevent the reoccurrence of at least one counter state.

26. The circuit of claim 23, wherein the oscillator means is a VCO with three op-amps producing at least three different clock phases.

27. The circuit of claim 23, wherein the digital storage means is a plurality of digital storage devices are shift registers.

28. The circuit of claim 23, wherein the digital storage means comprises a number of D-type flip-flops corresponding to the number of oscillator output clocks.

29. The circuit of claim 23, wherein the digital storage means comprise at least three shift registers.

30. The circuit of claim 23, wherein the digital storage means comprise five shift registers, each shift register having six D-type flip-flops.

31. The circuit of claim 23, wherein the digital storage means has a number d outputs, the oscillator means has a number n oscillator output clocks, and the circuit for generating multiple-phase clocks generates a number of multiple-phase clocks equal to d times n.

32. The circuit of claim 23, wherein the counter means has a number c counter outputs, the digital storage means has a number d storage devices connected to each counter output, and the circuit for generating multiple-phase clocks generates a number of multiple-phase clocks equal to c times d.

33. The circuit of claim 23, wherein the circuit for generating multiple-phase clocks generates a number of multiple-phase clocks equal to a total number of bits stored in the digital storage means.

34. A method for generating multiple-phase clocks, comprising:
   generating a plurality of output clock signals; and
   dividing the plurality of output clock signals to generate multiple-phase clock signals, wherein the dividing the plurality of output clock signals further comprises:
      counting through a number of states wherein at least some of the states have an associated output counting state signal;
      storing a plurality of bits based on at least some of the output clock signals; and
      outputting the stored plurality of bits based on the at least some of the output counting state signals, wherein the plurality of bits correspond to the multiple-phase clocks.

35. A wireless communications device, comprising:
   an oscillator having a plurality of oscillator stages and a plurality of oscillator output clocks produced by the plurality of oscillator stages; and
   a clock divider for receiving the oscillator output clocks, the clock divider further comprising:
      a counter having a plurality of counter outputs, wherein the counter outputs eventually cycle through a plurality of states; and
      a plurality of digital storage devices, wherein each digital storage device is coupled with an oscillator output clock, and at least one digital storage device is coupled to a counter output to produce the multiple-phase clocks wherein a number of multiple-phase clocks is greater than a number of oscillator output clocks.

36. The wireless communications device of claim 35 wherein the counter is a Johnson-type counter.

37. The wireless communications device of claim 35, wherein the counter is a Johnson-type counter having circuitry to prevent the reoccurrence of at least one counter state.

38. The wireless communications device of claim 35, wherein the oscillator includes a VCO with three op-amps produces at least three different clock phases.

39. The wireless communications device of claim 35, wherein the plurality of digital storage devices are shift registers.

40. The wireless communications device of claim 35, wherein the plurality of digital storage devices comprise a number of D-type flip-flops corresponding to the number of oscillator output clocks.

41. The wireless communications device of claim 39, wherein the shift registers comprise at least three shift registers.

42. The wireless communications device of claim 35, wherein the plurality of digital storage devices comprise five shift registers, each shift register having six D-type flip-flops.

43. The wireless communications device of claim 35, wherein the plurality of digital storage devices has a number d outputs, the oscillator has a number n oscillator output clocks, and the circuit for generating multiple-phase clocks generates a number of multiple-phase clocks equal to d times n.

44. The wireless communications device of claim 35, wherein the counter has a number c counter outputs, the plurality of digital storage devices has a number d storage devices connected to each counter output, and the circuit for generating multiple-phase clocks generates a number of multiple-phase clocks equal to c times d.

45. The wireless communications device of claim 35, wherein the circuit for generating multiple-phase clocks generates a number of multiple-phase clocks equal to a total number of bits stored in the plurality of digital storage devices.

46. A semiconductor chip, comprising:
an oscillator having a plurality of oscillator stages and a plurality of oscillator output clocks produced by the plurality of oscillator stages; and
a clock divider for receiving the oscillator output clocks, the clock divider further comprising:
a counter having a plurality of counter outputs, wherein the counter outputs eventually cycle through a plurality of states; and
a plurality of digital storage devices, wherein each digital storage device is coupled with an oscillator output clock, and at least one digital storage device is coupled to a counter output to produce the multiple-phase clocks wherein a number of multiple-phase clocks is greater than a number of oscillator output clocks.

47. The semiconductor chip of claim 46 wherein the counter is a Johnson-type counter.

48. The semiconductor chip of claim 46, wherein the counter is a Johnson-type counter having circuitry to prevent the reoccurrence of at least one counter state.

49. The semiconductor chip of claim 46, wherein the oscillator includes a VCO with three op-amps produces at least three different clock phases.

50. The semiconductor chip of claim 46, wherein the plurality of digital storage devices are shift registers.

51. The semiconductor chip of claim 46, wherein the plurality of digital storage devices comprise a number of D-type flip-flops corresponding to the number of oscillator output clocks.

52. The semiconductor chip of claim 50, wherein the shift registers comprise at least three shift registers.

53. The semiconductor chip of claim 46, wherein the plurality of digital storage devices comprise five shift registers, each shift register having six D-type flip-flops.

54. The semiconductor chip of claim 46, wherein the plurality of digital storage devices has a number d outputs, the oscillator has a number n oscillator output clocks, and the circuit for generating multiple-phase clocks generates a number of multiple-phase clocks equal to d times n.

55. The semiconductor chip of claim 46, wherein the counter has a number c counter outputs, the plurality of digital storage devices has a number d storage devices connected to each counter output, and the circuit for generating multiple-phase clocks generates a number of multiple-phase clocks equal to c times d.

56. The semiconductor chip of claim 46, wherein the circuit for generating multiple-phase clocks generates a number of multiple-phase clocks equal to a total number of bits stored in the plurality of digital storage devices.

57. A circuit for generating multiple-phase clocks, comprising:
a delay locked loop ("DLL"), the DLL having a plurality of delay cells; and
a clock divider for receiving the VCO output clocks, the clock divider further comprising:
a counter having a plurality of counter outputs, wherein the counter outputs eventually cycle through a plurality of states; and
a plurality of shift registers, wherein each shift register in the plurality of shift registers further comprises a plurality of registers, each shift register being coupled with the VCO output clocks, and at least one register in each shift register being coupled to a counter output to produce the multiple-phase clocks from the plurality of shift registers wherein a number of multiple-phase clocks is greater than a number of VCO output clocks.

58. The circuit of claim 57, wherein the counter is a Johnson-type counter.

59. The circuit of claim 57, wherein the counter is a Johnson-type counter having circuitry to prevent the reoccurrence of at least one counter state.

60. The circuit of claim 57, wherein the DLL has three delay cells producing six different clock phases.

61. The circuit of claim 57, wherein the shift registers comprise D-type flip-flops.

62. The circuit of claim 57, wherein the shift registers comprise a number of D-type flip-flops corresponding to the number of delay cells.

63. The circuit of claim 57, wherein the plurality of shift registers comprise at least three shift registers.

64. The circuit of claim 57, wherein the plurality of shift registers comprise five shift registers, each shift register having six D-type flip-flops.

65. The circuit of claim 57, wherein the counter has a number c counter outputs, the DLL has a number n output clocks, and the circuit for generating multiple-phase clocks generates a number of multiple-phase clocks equal to c times n.

66. The circuit of claim 57, wherein the counter has a number c counter outputs, each shift register contains r registers, and the circuit for generating multiple-phase clocks generates a number of multiple-phase clocks equal to c times r.

67. The circuit of claim 57, wherein the circuit for generating multiple-phase clocks generates a number of multiple-phase clocks less than or equal to a total number of bits stored in the plurality of shift registers.

68. A circuit for generating multiple-phase clock signals, comprising:
a clock circuit configured to generate two or more clock signals; and
a clock divider configured to receive and divide the two or more clock signals to produce three or more output clock signals, the clock divider further comprising:
a counter configured to cycle through a plurality of states to produce at least some output state signals in response to the plurality of states; and
a plurality of clocked sample and hold circuits wherein each clocked sample and hold circuit receives one of the two or more clock signals, and is coupled to the counter to produce one of the three or more output clock signals based on one of the output state signals.

* * * * *